United States Patent
Lee et al.

(10) Patent No.: US 10,380,029 B2
(45) Date of Patent: Aug. 13, 2019

(54) METHOD AND APPARATUS FOR MANAGING MEMORY

(71) Applicant: SAMSUNG ELECTRONICS CO., LTD., Suwon-si, Gyeonggi-Do (KR)

(72) Inventors: Jae-Don Lee, Yongin-si (KR); Min-Kyu Jeong, Yongin-si (KR); Jong-Pil Son, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 22 days.

(21) Appl. No.: 15/633,889

(22) Filed: Jun. 27, 2017

(65) Prior Publication Data

US 2018/0143909 A1    May 24, 2018

(30) Foreign Application Priority Data

Nov. 24, 2016 (KR) ......................... 10-2016-0157441

(51) Int. Cl.
*G06F 12/00* (2006.01)
*G06F 12/1009* (2016.01)
(Continued)

(52) U.S. Cl.
CPC ........ *G06F 12/1009* (2013.01); *G06F 3/0646* (2013.01); *G06F 3/0647* (2013.01); *G11C 7/1066* (2013.01); *G11C 29/42* (2013.01); *G06F 2212/1008* (2013.01); *G06F 2212/1024* (2013.01); *G06F 2212/65* (2013.01); *G06F 2212/657* (2013.01); *Y02D 10/13* (2018.01)

(58) Field of Classification Search
CPC ......... G06F 12/1009; G06F 2212/1008; G06F 2212/1024; G06F 2212/65; G06F 2212/657; G06F 3/0646; G06F 3/0647; G11C 7/1066; G11C 29/42
See application file for complete search history.

(56) References Cited

U.S. PATENT DOCUMENTS 5,854,771 A    12/1998  Mori
5,886,944 A    3/1999   Ahn
(Continued)

FOREIGN PATENT DOCUMENTS

JP    3741464    11/2005
JP    5039174    7/2012
(Continued)

OTHER PUBLICATIONS

Song, Han-Chun et al., "Development of Efficient Data Distribution Storage Algorithm for High Speed Data Backup in DRAM Based SSD", The Journal of the Institute of Internet, Broadcasting and Communication (IIBC), vol. 15, No. 6, pp. 11-15, Dec. 31, 2015.
(Continued)

*Primary Examiner* — Shawn X Gu
(74) *Attorney, Agent, or Firm* — F. Chau & Associates, LLC (57) ABSTRACT

A method of managing memory includes generating a page pool by aligning a plurality of pages of a memory; when a request to store first data is received, allocating a destination page corresponding to the first data using a page pool; and updating a page table using information about the allocated destination page.

14 Claims, 13 Drawing Sheets

(51) Int. Cl.
  *G06F 3/06* (2006.01)
  *G11C 7/10* (2006.01)
  *G11C 29/42* (2006.01)

(56) References Cited

U.S. PATENT DOCUMENTS

| | | | |
|---|---|---|---|
| 7,433,976 B2 | 10/2008 | Jeon | |
| 7,953,920 B2 | 5/2011 | Yano et al. | |
| 7,962,688 B2 | 6/2011 | Yano et al. | |
| 8,065,470 B2 | 11/2011 | Yano et al. | |
| 8,065,471 B2 | 11/2011 | Yano et al. | |
| 8,329,735 B2 | 12/2012 | Ermann et al. | |
| 9,244,824 B2 | 1/2016 | Lim et al. | |
| 2011/0231713 A1* | 9/2011 | Takada | G06F 12/0246 714/54 |
| 2016/0170670 A1* | 6/2016 | Lesartre | G06F 13/28 711/135 |
| 2017/0123670 A1* | 5/2017 | Jayasena | G06F 3/061 |

FOREIGN PATENT DOCUMENTS

| | | |
|---|---|---|
| KR | 10-0172239 | 10/1998 |
| KR | 10-0234714 | 9/1999 |
| KR | 10-0640555 | 10/2006 |
| KR | 1020110103258 | 9/2011 |
| KR | 1020140005760 | 1/2014 |
| WO | 2014092876 | 6/2014 |
| WO | 2014092884 | 6/2014 |

OTHER PUBLICATIONS

Seshadri, Vivek et al., "RowClone: Fast and Energy-Efficient In-DRAM Bulk Data Copy and Initialization", Micro-46, Dec. 7-11, 2013, Davis, CA, USA, pp. 1-13.

European Search Report dated Oct. 30, 2017 in the corresponding EP Application No. 17189771.3.

* cited by examiner

- IDDCopyDstAlloc(src, size)
- IDDCopySet(dest, src, size)
- IDDCopyStart()

METHOD AND APPARATUS FOR MANAGING MEMORY

CROSS-REFERENCE TO RELATED APPLICATION

This application claims priority under 35 U.S.C. § 119 to Korean Patent Application No. 10-2016-0157441, filed on Nov. 24, 2016, in the Korean Intellectual Property Office, the disclosure of which is incorporated by reference herein in its entirety.

TECHNICAL FIELD

The inventive concept relates to a method and apparatus for managing memory.

DISCUSSION OF RELATED ART

Application programs may include any program designed to perform a specific function directly for a user or, in some cases, for another application program. Application programs typically require data processing systems having high performance. Therefore, various in-memory data copying methods for avoiding memory latency overhead have been used.

In a dynamic random-access memory (DRAM), data copying refers to a process of copying data from one area of the DRAM to another area of the DRAM. When data is copied in the DRAM and a central processing unit (CPU) intervenes in this process, the performance of the DRAM may deteriorate.

SUMMARY

According to an exemplary embodiment of the inventive concept, there is provided a method of managing memory, the method including: generating a page pool by aligning a plurality of pages of a memory; when a request to store first data is received, allocating a destination page corresponding to the first data using the page pool; and updating a page table using information about the allocated destination page.

According to an exemplary embodiment of the inventive concept, there is provided an apparatus for managing memory, the apparatus including a controller configured to: generate a page pool by aligning a plurality of pages of a memory; when a request to store first data is received, allocate a destination page corresponding to the first data using the page pool; and update a page table using information about the allocated destination page.

According to an exemplary embodiment of the inventive concept, there is provided a method of managing memory, the method including: dividing a memory into a plurality of pages and generating a page pool by aligning the pages; allocating a destination page to have a same rank as that of a source page, when a request for in-memory copying is received; and updating a page table by mapping a physical address corresponding to the destination page to a continuous logical address.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Exemplary embodiments of the inventive concept will now be described more fully with reference to the accompanying drawings.

Figure 1:
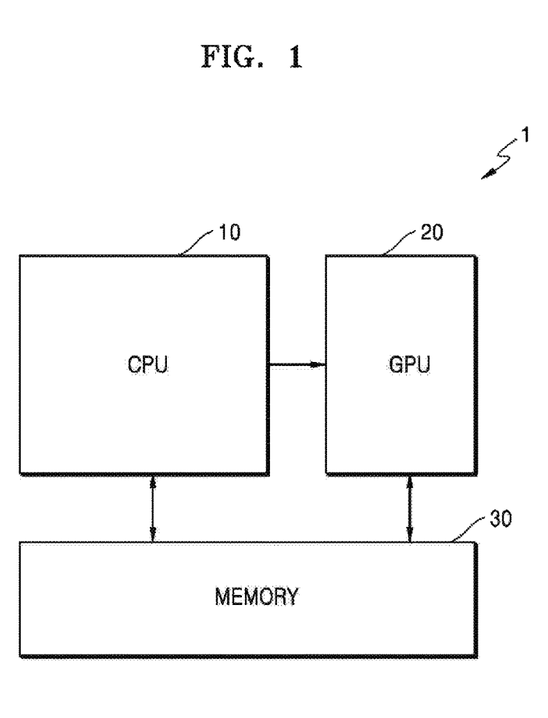
FIG. 1 is a block diagram of a data processing system according to an exemplary embodiment of the inventive concept.

FIG. 1 is a block diagram of a data processing system 1 according to an exemplary embodiment of the inventive concept.

Referring to FIG. 1, the data processing system 1 includes a central processing unit (CPU) 10 and memory 30. In addition, the data processing system 1 includes a graphics processing unit (GPU) 20.

The CPU 10 receives external information (e.g., data, commands, addresses, etc.), interprets and calculates instructions of a computer program, and outputs a calculation result. For example, the CPU 10 may interpret and execute instructions of a computer program provided in a machine language. The CPU 10 may control an overall operation of the data processing system 1 by exchanging information within the data processing system 1.

When the data processing system 1 includes the GPU 20, the CPU 10 generates a draw call to be transmitted to the GPU 20 by using path data. The term 'path' used herein may refer to an element constituting an object to be rendered. In other words, the object may include a closed polygon or a closed path formed by connecting at least one path. For example, the path may correspond to a line or a curve.

The GPU 20 receives the draw call and performs path rendering by using primitive data stored in the memory 30. In other words, the GPU 20 may calculate a color value of each of pixels included in a frame by using the primitive data. The term 'frame' used herein may refer to an image to be displayed on a screen, and one image is formed by setting a color to each of the pixels included in the frame. For example, one pixel may be set with a red color and another pixel may be set with a green color.

For example, the GPU 20 may include a vertex shader, a rasterizer, a fragment shader, a pixel shader, and a frame buffer. The term 'primitive' used herein may refer to an element used in rendering. A result obtained after dividing a path may be referred to as a primitive, or a path and a primitive may be the same.

The memory 30 stores information or data used to operate the CPU 10 and the GPU 20. The memory 30 also stores a result obtained after the CPU 10 and the GPU 20 process data. For example, the memory 30 may be a dynamic random-access memory (DRAM).

Data stored in the memory 30 may be copied to another area of the memory 30. In other words, data may be copied from a source area of the memory 30 to a destination area of the memory 30. For example, data may be copied from a first area of the memory 30 to a second area of the memory 30.

A process of copying data from a source area of the memory 30 to a destination area of the memory 30 will now be explained with reference to FIG. 2.

Figure 2:
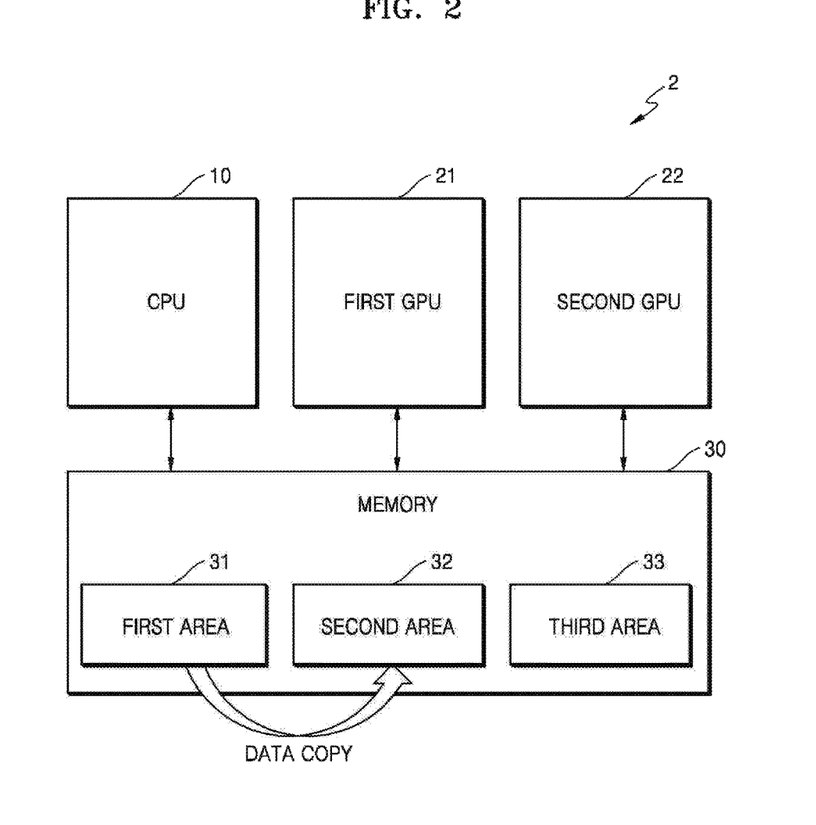
FIG. 2 is a block diagram for explaining a process of copying data according to an exemplary embodiment of the inventive concept.

FIG. 2 is a block diagram for explaining a process of copying data according to an exemplary embodiment of the inventive concept.

Referring to FIG. 2, a data processing system 2 includes the CPU 10, a plurality of GPUs (e.g., first and second GPUs 21 and 22), and the memory 30. Although two GPUs are illustrated in FIG. 2, exemplary embodiments of the inventive concept are not limited thereto. For example, more than two GPUs may be provided in a data processing system of the inventive concept.

The memory 30 is connected to the CPU 10 and the first and second GPUs 21 and 22 and stores data. In this case, the memory 30 may be divided into a plurality of areas (e.g., first through third areas 31, 32, and 33). At least one area from among the first through third areas 31, 32, and 33 may be allocated to the CPU 10 and the first and second GPUs 21 and 22. For example, the first area 31 may be allocated to the CPU 10, the second area 32 may be allocated to the first GPU 21, and the third area 33 may be allocated to the second GPU 22. Accordingly, information or data used to operate the CPU 10 and a calculation result of the CPU 10 may be stored in the first area 31.

When the first GPU 21 operates according to the calculation result of the CPU 10, data stored in the first area 31 (e.g., a source area) has to be copied to the second area 32 (e.g., a destination area). This is because since an area allocated to the first GPU 21 is the second area 32, the first GPU 21 may not access the data stored in the first area 31. Accordingly, as the CPU 10 and the first and second GPUs 21 and 22 operate, the memory 30 may perform a process of copying data stored in a source area to a destination area.

Referring back to FIG. 1, the CPU 10 may intervene in a process of copying data from a source area to a destination area. For example, the CPU 10 may read data stored in the source area, and then, may write the read data to the destination area. In this case, the performance of the memory 30 may deteriorate due to a bandwidth and a latency of a channel between the CPU 10 and the memory 30.

An apparatus for managing memory according to an exemplary embodiment of the inventive concept may allocate a destination area so that the destination area is the same as a source area. For example, the apparatus for managing the memory may allocate the destination area so that the source area and the destination area are included in the same channel and in the same rank. Each of the source area and the destination area may be, but not limited to, a page or a chunk of the memory 30. Accordingly, as the apparatus for managing the memory operates, the performance of the memory 30 may increase.

For example, the apparatus for managing the memory according to an exemplary embodiment of the inventive concept may be included in the memory 30, and may be included as an independent apparatus in the data processing system 1. In addition, the apparatus for managing the memory may include a controller, and the controller may control an overall operation of the apparatus for managing the memory. For convenience, the following description will be made on the assumption that the controller of the apparatus for managing the memory performs a method of managing a memory according to an exemplary embodiment of the inventive concept.

Figure 3:
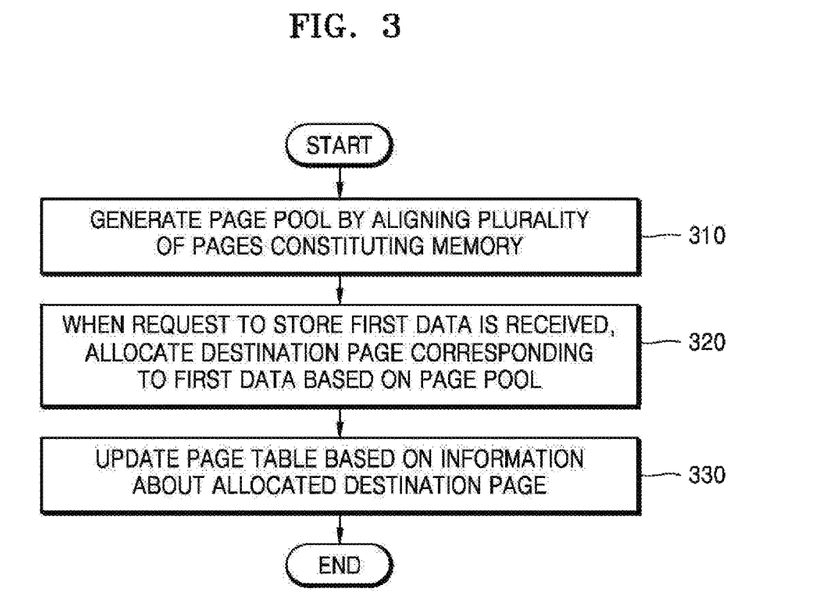
FIG. 3 is a flowchart of a method of managing memory according to an exemplary embodiment of the inventive concept.

FIG. 3 is a flowchart of a method of managing memory according to an exemplary embodiment of the inventive concept.

In operation 310, the controller generates a page pool by aligning a plurality of pages constituting the memory. For example, the controller may generate the page pool by aligning the plurality of pages according to ranks. The memory may be, but not limited to, a DRAM.

The memory may include a plurality of ranks, and a plurality of pages may be included in one rank. The controller may align a plurality of pages included in the memory according to ranks.

In operation 320, the when a request to store first data is received, a destination pace is allocated corresponding to the first data based on the page pool. In operation 330, a page table is updated based on information about the allocated destination page.

A structure of the memory will now be explained with reference to FIG. 4.

Figure 4:
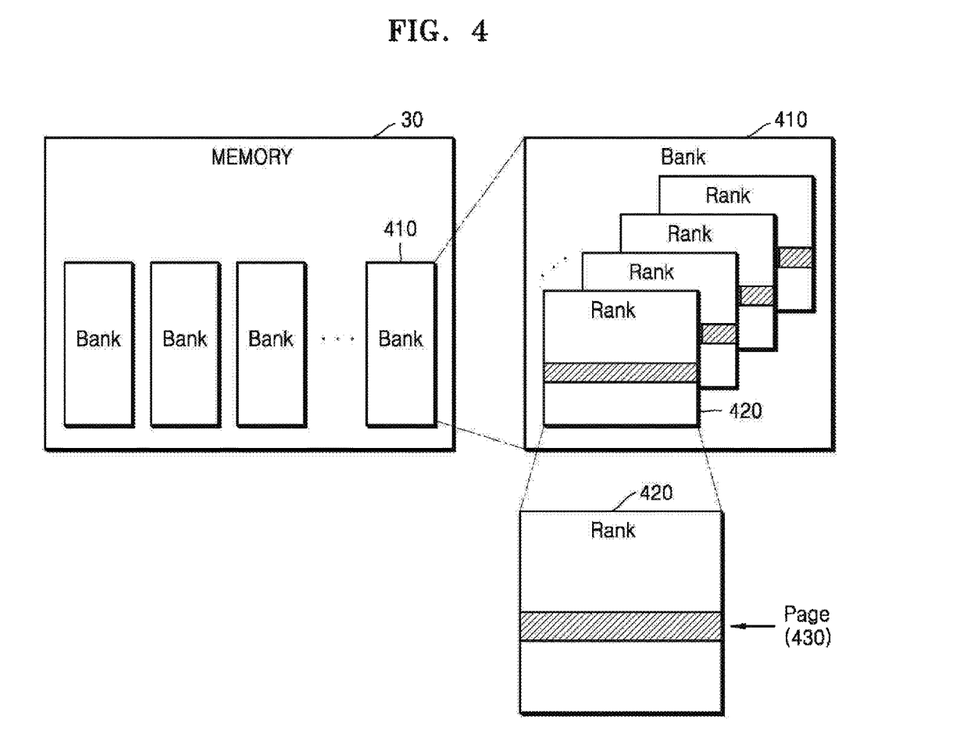
FIG. 4 is a block diagram of memory according to an exemplary embodiment of the inventive concept.

FIG. 4 is a block diagram of the memory 30 according to an exemplary embodiment of the inventive concept.

FIG. 4 illustrates a structure of the memory 30 according to an exemplary embodiment of the inventive concept. In the memory 30, a plurality of banks 410 may be connected to one another and a plurality of ranks 420 may be included in each of the banks 410. For example, when the bank 410 is a module having a capacity of 128 megabytes (MB), eight ranks 420 each having a capacity of 16384*1024 bytes may be included in the bank 410.

One rank 420 may be expressed as a matrix including a plurality of rows and a plurality of columns. Accordingly, a row detector that writes/reads data to/from rows of the plurality of ranks 420 and a column detector that writes/reads data to/from columns of the plurality of ranks 420 may be connected to the bank 410.

The same rows or the same columns in the plurality of ranks 420 included in the bank 410 refer to pages 430. For example, when eight ranks 420 each having a capacity of 16384*1024 bytes are included in the bank 410, the page 430 may have a storage capacity of at least one kilobyte (KB).

Data copy in the memory 30 may be performed in units of the pages 430. Accordingly, the controller may generate a page pool by aligning the plurality of pages 430 constituting the memory 30. Data copy in the memory 30 may be performed in units of chunks that are smaller than the pages 430. Accordingly, the controller may generate a chunk pool by aligning chunks constituting the memory 30.

A process performed by the controller to generate a page pool by aligning the pages 430 will now be explained with reference to FIGS. 5 and 6.

Figure 5:
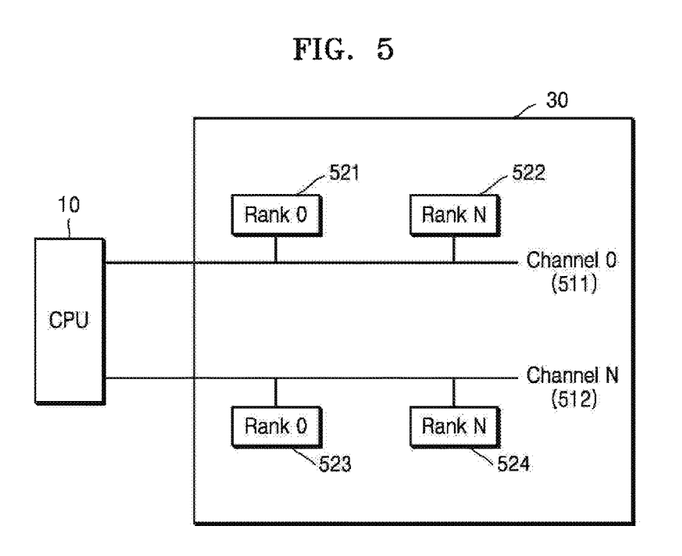
FIG. 5 is a diagram for explaining a process performed by a controller to align pages according to an exemplary embodiment of the inventive concept.

FIG. 5 is a diagram for explaining a process performed by the controller to align pages according to an exemplary embodiment of the inventive concept.

FIG. 5 illustrates the memory 30 connected through a plurality of channels 511 and 512 to the CPU 10 according to an exemplary embodiment of the inventive concept. Each of the channels 511 and 512 is a path through which data is transmitted/received between the CPU 10 and the memory 30.

A plurality of ranks 521, 522, 523, and 524 may be connected to the channels 511 and 512. For example, N ranks 521 and 522 may be connected to the channel 511, and N ranks 523 and 524 may be connected to the channel 512.

When a source area is the rank 521 and a destination area is the rank 522, data has to be read from the rank 521 and has to be written to the rank 522 through the channel 511. Accordingly, since the channel 511 intervenes in a process of copying data, the performance of the memory 30 may deteriorate.

In addition, when a source area is the rank 521 and a destination area is the rank 523, data has to be read from the rank 521 and has to be written to the rank 523 through the channels 511 and 512 and the CPU 10. Accordingly, since the channels 511 and 512 and the CPU 10 intervene in a process of copying data, the performance of the memory 30 may deteriorate.

When both a source area and a destination area are the rank 521, data may be rapidly and efficiently copied. For example, when a source area and a destination area are pages in the rank 521, data may be rapidly and efficiently copied. Accordingly, when a source area and a destination area of data are allocated to pages in the same rank, power consumed when data is copied may be reduced and a time taken to copy the data may also be reduced.

The controller generates a page pool by aligning a plurality of pages included in the memory 30 according to the ranks 521, 522, 523, and 524. When a request to store data is received, the controller may allocate a destination page so that a source page in which the data is stored and the destination page to which the data is to be copied are included in the same rank.

Figure 6:
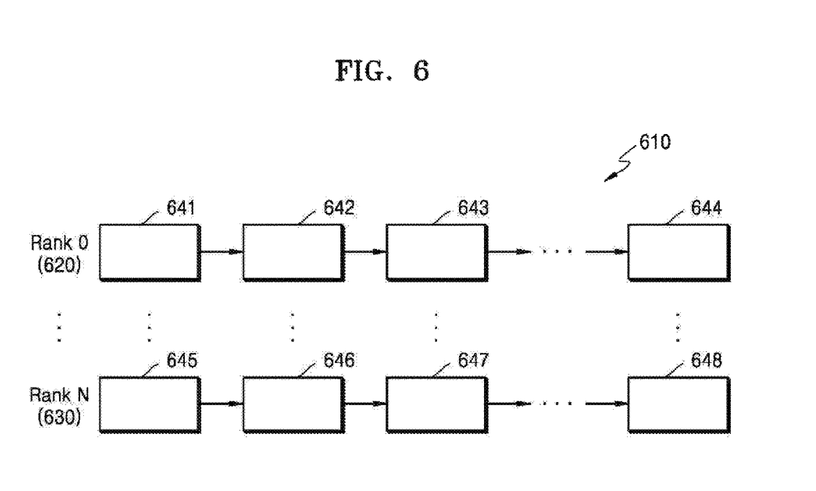
FIG. 6 is a diagram of a page pool according to an exemplary embodiment of the inventive concept.

FIG. 6 is a diagram of a page pool 610 according to an exemplary embodiment of the inventive concept.

FIG. 6 illustrates the page pool 610 according to an exemplary embodiment of the inventive concept. For example, the page pool 610 may be a table in which pages 641 through 648 are aligned according to ranks 620 and 630.

For example, the controller may recognize that the pages 641 through 644 are included in the same rank 620 and may perform a grouping so that the pages 641 through 644 correspond to the rank 620. Similarly, the controller may perform a grouping so that the pages 645 through 648 correspond to the rank 630.

As the controller generates the page pool 610, the controller may allocate a destination page so that a source page and the destination page are included in the same rank 620.

Referring back to FIG. 3, in the operation 320, when a request to store first data is received, the controller allocates a destination page corresponding to the first data based on the page pool. The first data may be, but not limited to, data having a size corresponding to a capacity of a page.

For example, the controller may allocate the destination page so that the destination page and a page (e.g., a source page) in which the first data is stored are included in the same rank. Alternatively, the controller may allocate the destination page so that the destination page and the source page are included in the same rank and the same channel.

When the request to store the first data is received, the controller checks the page pool and searches for a page in which the first data may be stored. For example, the controller may search for a page that allows the source page and the destination page of the first data to be included in the same rank from among pages included in the page pool. Alternatively, the controller may search for a page that allows the source page and the destination page of the first data to be included in the same rank and the same channel from among the pages included in the page pool. The controller allocates the found page to the destination page of the first data.

In operation 330, the controller updates a page table based on information about the allocated destination page. The term 'page table' used herein may refer to a table in which a logical address and a physical address of a page are mapped to each other. For example, the controller may update the page table by mapping a physical address corresponding to the destination page to a continuous logical address.

The controller may pre-allocate a data copy area (hereinafter, referred to as an 'IDDC area') to an address space. The term 'address space' used herein may refer to a space in which a logical address of the memory 30 (or a page of the memory 30) is defined. For example, the CPU 10 (or the GPU 20) may determine a position at which data is stored in the memory 30 by referring to the logical address defined in the address space.

The logical address defined in the address space and a physical address of the memory 30 (or the page of the memory 30) may be different from each other. Accordingly, the CPU 10 (or the GPU 20) may determine a position at which data is stored in the memory 30 by referring to the logical address defined in the address space and the page table.

A process performed by the controller to update the page table will now be explained with reference to FIG. 7.

Figure 7:
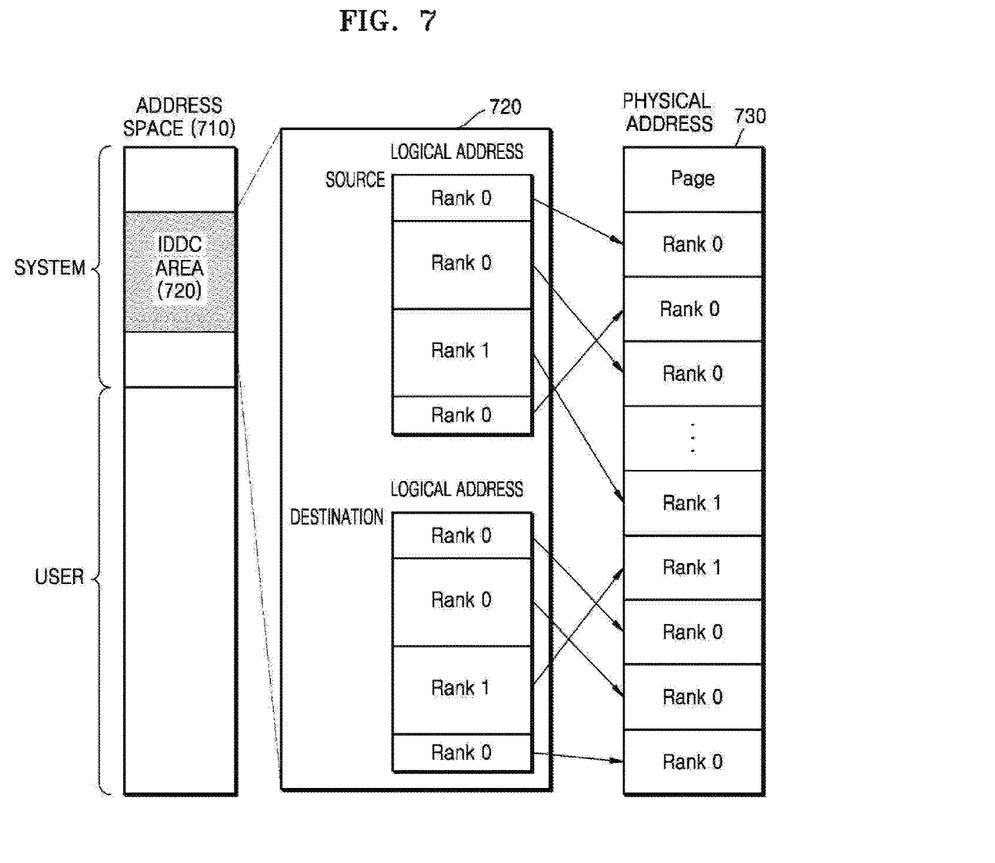
FIG. 7 is a diagram for explaining a process performed by the controller to update a page cable according to an exemplary embodiment of the inventive concept.

FIG. 7 is a diagram for explaining a process performed by the controller to update a page table according to an exemplary embodiment of the inventive concept.

FIG. 7 illustrates an address space 710 including an IDDC area 720 and a rank allocated to a page 730 according to an exemplary embodiment of the inventive concept.

The page 730 may be a combination of parts allocated to at least one rank. In other words, parts constituting the page 730 may be respectively allocated to ranks, and types of the ranks may be various. For example, some parts of the page 730 may be included in 'ranks 0', and other parts of the page 730 may be included in 'ranks 1'. In addition, a physical address of each of the parts of the page 730 may be set.

The address space 710 may be divided into a space in which settings of a system are recorded and a space in which settings of a user are recorded. The controller may allocate the IDDC area 720 to the space in which the settings of the system are recorded. Logical addresses of parts of the page 730 may be defined in the IDDC area 720.

A physical address and a logical address may be different from each other. Accordingly, the controller generates a page table in which a physical address and a logical address of the same part of the page 730 are mapped to each other, and updates the page table as a destination page is allocated.

For example, the controller may divide the memory in units of pages, and may allocate a free page having the same rank as that of a source page to a destination page. The controller may update the page table by mapping a physical address and a logical address of the destination page.

Figure 8:
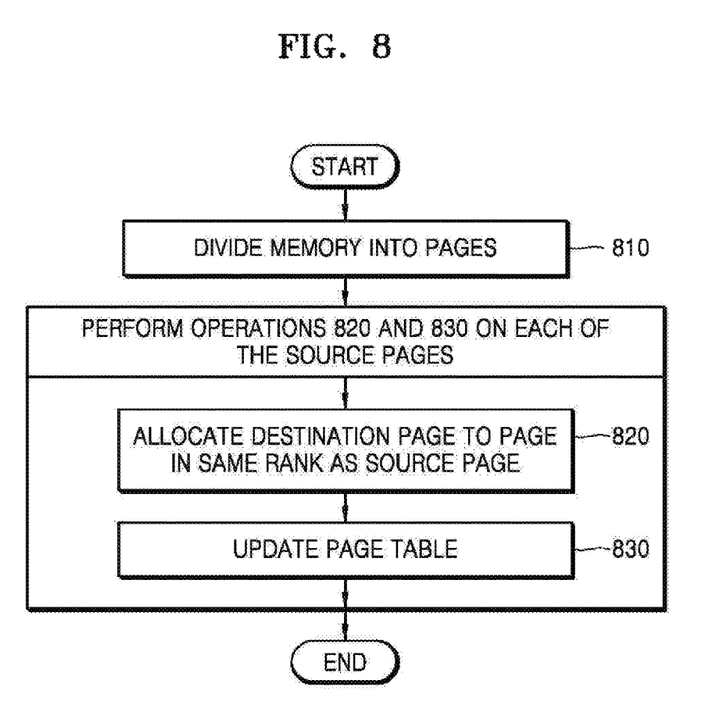
FIG. 8 is a flowchart of a method of managing memory according to an exemplary embodiment of the inventive concept.

FIG. 8 is a flowchart of a method of managing memory according to an exemplary embodiment of the inventive concept.

The method of FIG. 8 includes operations performed by the controller of FIGS. 1 through 7. Accordingly, the descriptions made with reference to FIGS. 1 through 7 may apply to the method of FIG. 8.

In operation 810, the controller divides the memory in units of pages. For example, the controller divides the memory into a plurality of pages and generates a page pool by aligning the pages. For example, the controller may generate the page pool by aligning the plurality of pages according to ranks.

In operation 820, the controller allocates a destination page to a page having the same rank as that of a source page. For example, the controller may allocate the destination page so that the destination page and a page in which first data is stored (e.g., a source page) are included in the same rank. Alternatively, the controller may allocate the destination page so that the destination page and the source page are included in the same rank and the same channel.

In operation 830, the controller updates a page table. For example, the controller may update the page table by mapping a physical address corresponding to the destination page to a continuous logical address.

The controller performs operations 820 and 830 on each of the source pages. For example, operations 820 and 830 may be performed on all of the source pages. In other words, whenever a request to store data is received, the controller repeatedly performs operations 820 and 830.

Data requested to be stored may be a chunk smaller than a page. Accordingly, the controller may generate a chunk pool by aligning chunks constituting the memory 30. The controller may allocate a destination chunk of the data requested to be stored based on the chunk pool.

A process performed by the controller to generate the chunk pool and allocate the destination chunk will now be explained with reference to FIGS. 9 through 11.

Figure 9:
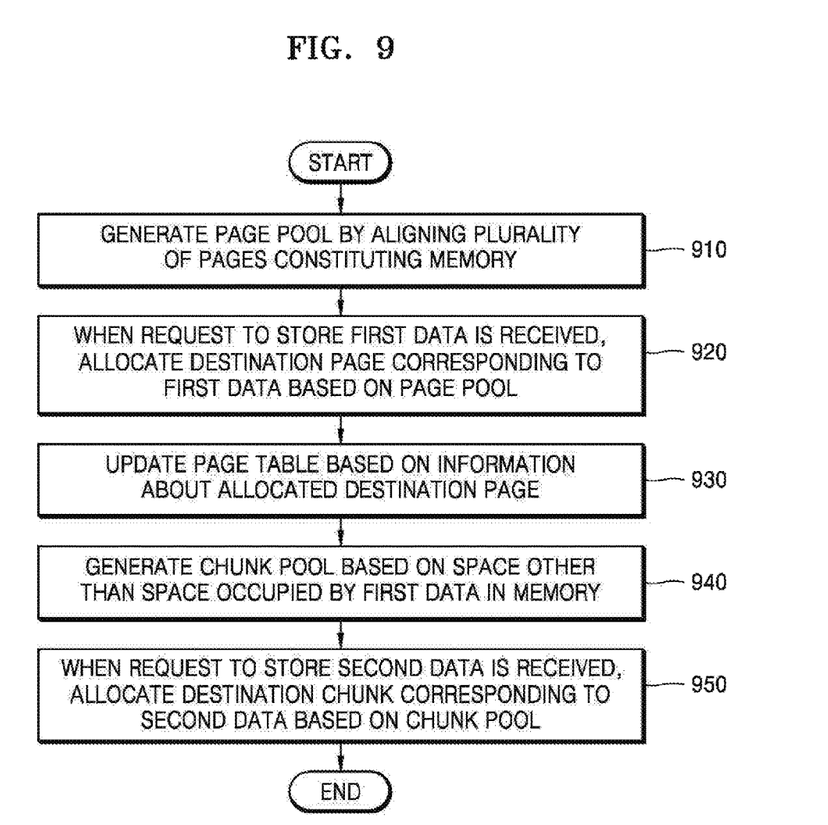
FIG. 9 is a flowchart of a method of managing memory according to an exemplary embodiment of the inventive concept.

FIG. 9 is a flowchart of a method of managing memory according to an exemplary embodiment of the inventive concept.

The method of FIG. 9 includes operations performed by the controller of FIGS. 1 through 8. Accordingly, the descriptions made with reference to FIGS. 1 through 8 may apply to the method of FIG. 9.

Operations 910 through 930 of FIG. 9 are the same as operations 310 through 330 of FIG. 3. Accordingly, a detailed explanation of operations 910 through 930 will not be given.

In operation 940, the controller generates a chunk pool based on a space other than a space occupied by the first data in the memory. For example, the controller allocates the destination page of the first data and inserts a space other than the destination page allocated to the first page into the chuck pool.

In operation 950, when a request to store second data is received, the controller allocates a destination chuck corresponding to the second data based on the chunk pool.

A process performed by the controller to generate the chunk pool will now be explained with reference to FIGS. 10 and 11.

Figure 10:
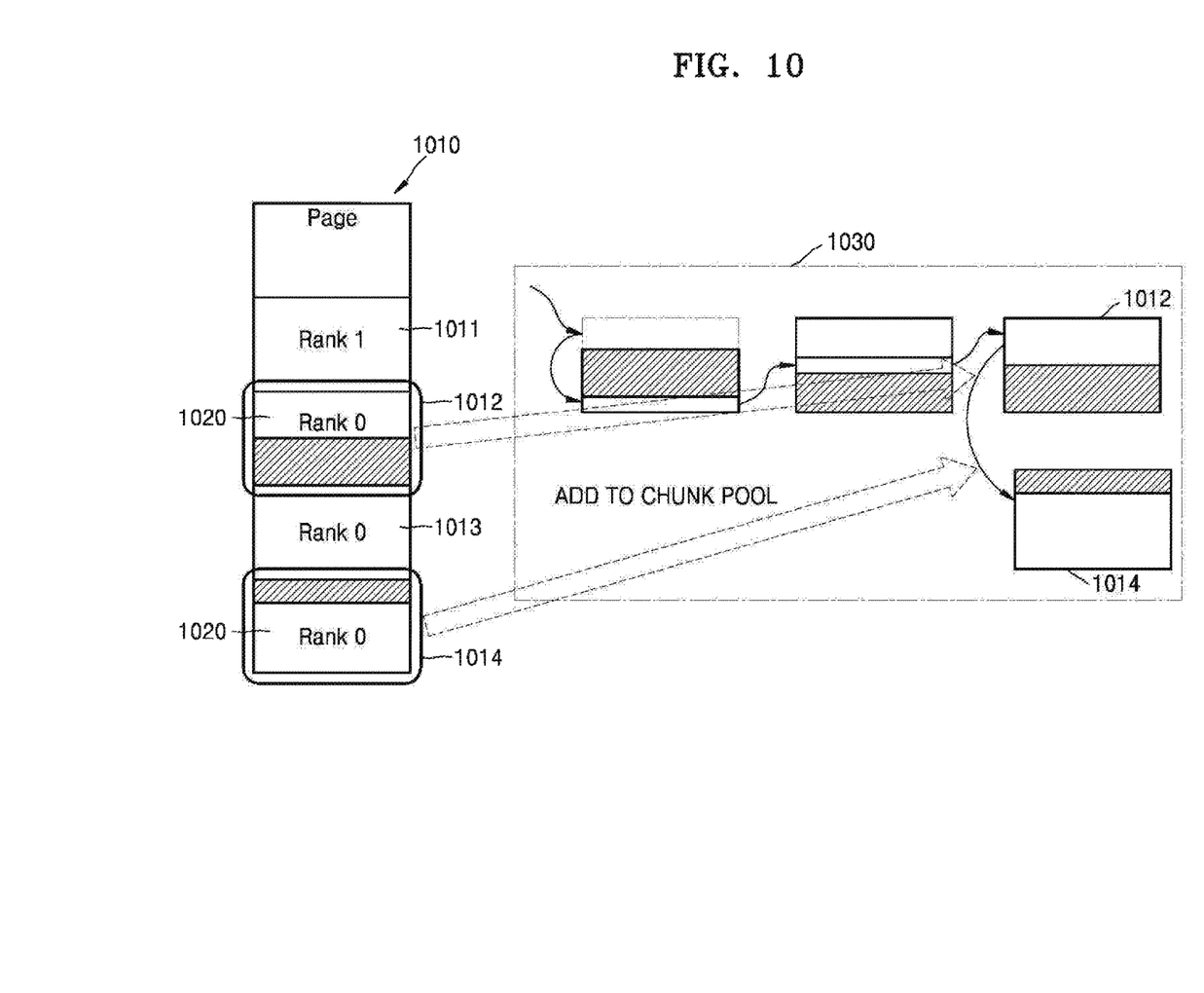
FIG. 10 is a diagram for explaining a process performed by the controller to generate a chunk pool according to an exemplary embodiment of the inventive concept.

FIG. 10 is a diagram for explaining a process performed by the controller to generate a chunk pool according to an exemplary embodiment of the inventive concept.

FIG. 10 illustrates a rank allocated to a page 1010. Parts constituting the page 1010 may be respectively allocated to ranks, and types of the ranks may be various. For example, some parts of the page 1010 may be included in 'ranks 0', and other parts of the page 1010 may be included in 'ranks 1'.

When a request to store first data is received, the controller allocates a destination page of the first data. For example, the destination page of the first data may be allocated to the 'rank 0'. In this case, a chunk 1020 that is a free storage space may be formed in parts 1012 and 1014 allocated to the destination page from among parts 1011, 1012, 1013, and 1014 constituting the page 1010.

The controller inserts the parts 1012 and 1014 in which the chunk 1020 is formed into a chunk pool 1030. Accordingly, when a request to store second data is received, the controller may allocate a destination chunk of the second data based on the chunk pool 1030.

Figure 11:
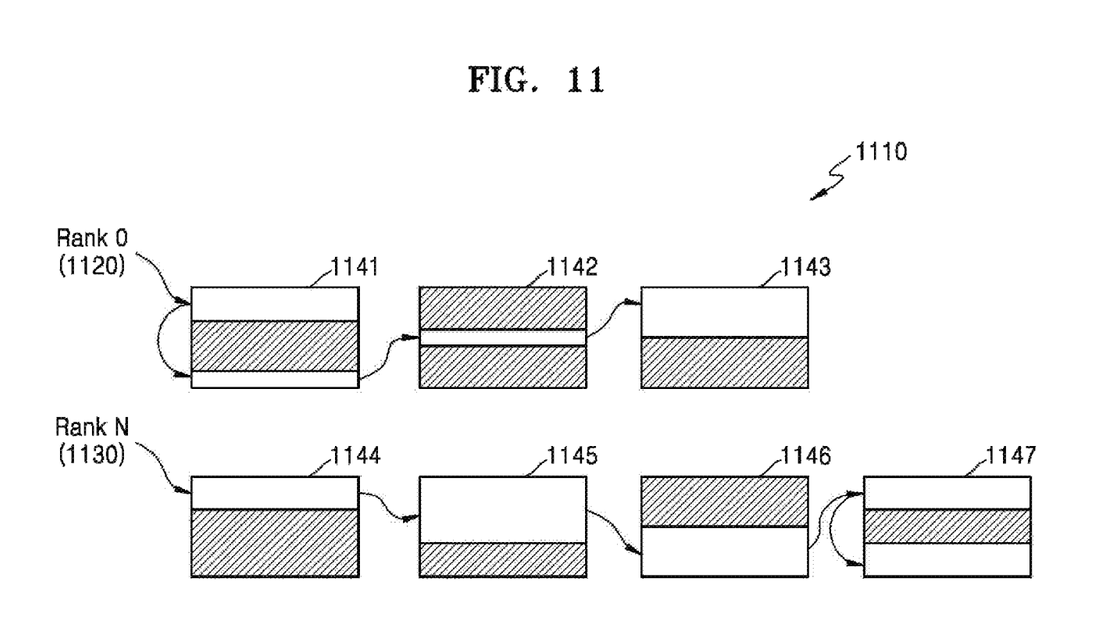
FIG. 11 is a diagram of a chunk pool according to an exemplary embodiment of the inventive concept.

FIG. 11 is a diagram of a chunk pool 1110 according to an exemplary embodiment of the inventive concept.

FIG. 11 illustrates the chunk pool 1110 according to an exemplary embodiment of the inventive concept. For example, the chunk pool 1110 may be a table in which parts 1141 through 1147 each including a chunk are aligned according to ranks 1120 and 1130.

For example, the controller may recognize that the parts 1141 through 1143 are included in the same rank 1120 and may perform a grouping so that the parts 1141 through 1143 correspond to the rank 1120. Similarly, the controller may perform a grouping so that the parts 1144 through 1147 correspond to the rank 1130.

As the controller generates the chunk pool 1110, the controller may allocate a destination chunk so that a source chunk and the destination chunk of data are included in the same rank 1120 or 1130.

Referring back to FIG. 9, in the operation 950, when a request to store second data is received, the controller allocates a destination chunk corresponding to the second data based on the chunk pool. The term 'second data' used herein may refer to data occupying a storage space smaller than a storage space corresponding to a page.

For example, the controller may allocate the destination chunk so that the destination chunk and a chunk (e.g., a source chunk) in which the second data is stored are included in the same rank. Alternatively, the controller may allocate the destination chunk so that the destination chunk and the source chunk are included in the same rank and the same channel.

In addition, the controller may update the page table based on information about the allocated destination chunk. For example, the controller may update the page table by mapping a physical address corresponding to the destination chunk to a continuous logical address. A process performed by the controller to update the page table is the same as or substantially similar to that described with reference to FIG. 7.

Figure 12:
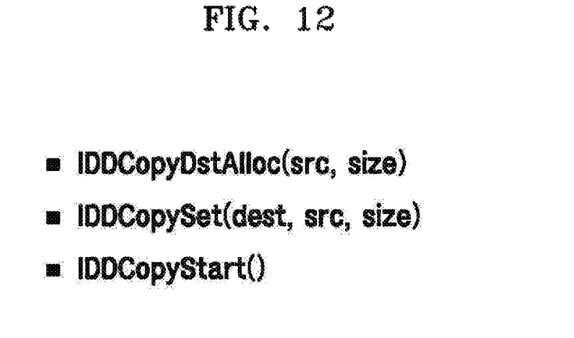
FIG. 12 is a diagram of an application programming interface (API) for performing a method of managing memory according to an exemplary embodiment of the inventive concept.

FIG. 12 is a diagram of an application programming interface (API) for performing a method of managing memory according to an exemplary embodiment of the inventive concept.

When IDDCopyDstAlloc(src, size) is input, the controller interprets a physical address of a source page/chunk (src), and allocates a page/chunk that is in the same channel and the same rank as those of the source page/chunk (src) as a destination page/chunk.

When IDDCopySet(dest, src, size) is input, the controller sets register values such as an address of the source page/chunk (src) and an address of a destination page/chunk (dest) in a data copy module located in the memory 30.

When IDDCopyStart( ) is input, the controller commands the data copy module to copy data from the source page/chunk (src) to the destination page/chunk (dest).

Figure 13A:
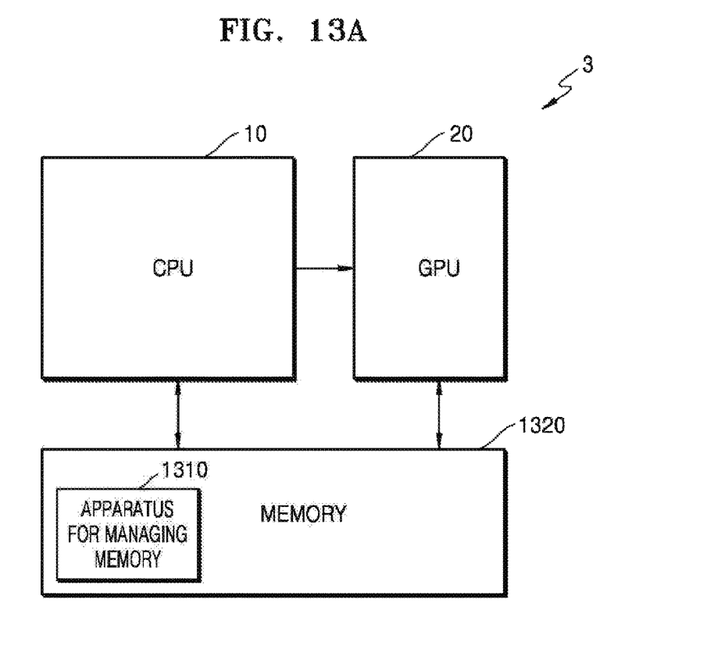
FIGS. 13A and 13B are block diagrams illustrating an arrangement for managing memory according to an exemplary embodiment of the inventive concept.
Figure 13B:
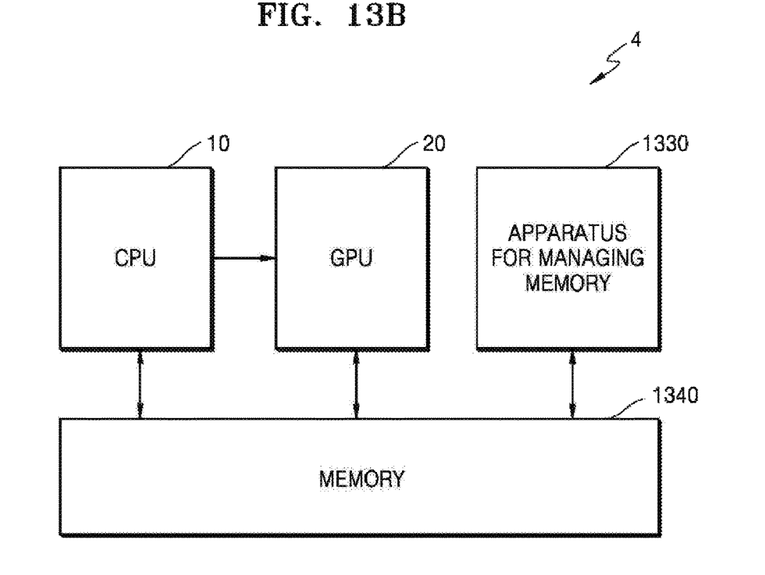

FIGS. 13A and 13B are block diagrams illustrating an apparatus for managing memory according to an exemplary embodiment of the inventive concept.

Data processing systems 3 and 4 of FIGS. 13A and 13B include the CPU 10, the GPU 20, memories 1320 and 1340, and apparatuses 1310 and 1330 for respectively managing the memories 1320 and 1340. In addition, each of the apparatuses 1310 and 1330 include the controller of FIGS. 1 through 12.

Referring to FIG. 13A, the apparatus 1310 may be included in the memory 1320. In this case, a method of managing memory according to an exemplary embodiment of the inventive concept may be performed without changing a hardware structure of the data processing system 3.

Referring to FIG. 13B, the apparatus 1330 may be included as an independent apparatus in the data processing system 4. In this case, the apparatus 1330 may be connected to the CPU 10, the GPU 20, and the memory 1340 and may perform a method of managing memory according to an exemplary embodiment of the inventive concept.

As described above, since data stored in a memory may be copied to another space of the memory without intervention of a CPU, a process of copying data in the memory may become more efficient.

The afore-described method may be implemented as an executable program, and may be executed by a general-purpose digital computer that runs the program by using a computer-readable recording medium. In addition, a structure of data used in the method may be recorded by using various units on a computer-readable recording medium. Examples of the computer-readable recording medium include storage media such as magnetic storage media (e.g., read only memories (ROMs), floppy discs, or hard discs), optically readable media (e.g., compact disk-read only memories (CD-ROMs), or digital versatile disks (DVDs)), etc.

While the inventive concept has been particularly shown and described with reference to embodiments thereof, the inventive concept should not be construed as limited to those embodiments. For example, it will be understood that various changes in form and details may be made thereto without departing from the spirit and scope of the inventive concept as defined by the claims.

What is claimed is:

1. A method of managing memory, the method comprising:
    generating a page pool by aligning a plurality of pages of a memory according to ranks of the memory;
    when a request to store first data is received, allocating a destination page corresponding to the first data by searching for a page that allows a source page of the first data and the destination page to be included in the same rank from among the pages included in the page pool; and
    updating a page table using information about the allocated destination page.

2. The method of claim 1, wherein the destination page is a page to which the first data is copied.

3. The method of claim 1, wherein the destination page is allocated so that the destination page and the source page are included in a same channel.

4. The method of claim 1, wherein the page table is updated by mapping a physical address corresponding to the destination page to a continuous logical address.

5. The method of claim 1, further comprising generating a chunk pool using a space other than a space occupied by the first data in the memory.

6. A non-transitory computer-readable recording medium having embodied thereon a program for executing the method of claim 1 in a computer.

7. AD apparatus for managing memory, the apparatus comprising a controller executing a program embodied on a non-transitory medium, the program causing the controller to:
    generate a page pool by aligning a plurality of pages of a memory according to ranks of the memory;
    when a request to store first data is received, allocate a destination page corresponding to the first data by searching for a page that allows a source page of the first data and the destination page to be included in the same rank from among the pages included in the page pool; and
    update a page table using information about the allocated destination page.

8. The apparatus of claim 7, wherein the destination page comprises a page to which the first data is copied.

9. The apparatus of claim 7, wherein the controller is further configured to allocate the destination page so that the destination page and the source page are included in a same channel.

10. The apparatus of claim 7, wherein the controller is further configured to update the page table by mapping a physical address corresponding to the destination page to a continuous logical address.

11. The apparatus of claim 7, wherein the controller is further configured to generate a chunk pool using a space other than a space occupied by the first data in the memory.

12. A method of managing memory, the method comprising:
    dividing a memory into a plurality of pages and generating a page pool by aligning the pages, wherein the page pool is generated by aligning the plurality of pages according to ranks;
    allocating a destination page to have a same rank as that of a source page, when a request for in-memory copying is received, wherein the destination page is allocated to have a same channel as that of the source page, wherein the source page and the destination page are included in the memory; and
    updating a page table by mapping a physical address corresponding to the destination page to a continuous logical address.

13. The method of claim 12, further comprising copying data from the source page to the destination page using the page table.

14. The method of claim 13, wherein the copying occurs without intervention of a central processing unit (CPU).

* * * * *